United States Patent [19]

Baskett et al.

[11] Patent Number: 4,585,959
[45] Date of Patent: Apr. 29, 1986

[54] TRI-STATE LOGIC GATE HAVING REDUCED MILLER CAPACITANCE

[75] Inventors: Ira E. Baskett; Cleon Petty, both of Tempe, Ariz.

[73] Assignee: Motorola, Inc., Schaumburg, Ill.

[21] Appl. No.: 566,768

[22] Filed: Dec. 29, 1983

[51] Int. Cl.[4] .................. H03K 19/003; H03K 19/088; H03K 19/092; H03K 17/60

[52] U.S. Cl. .................................. 307/473; 307/300; 307/443

[58] Field of Search ............... 307/443, 473, 474, 475, 307/555, 542, 280, 300, 254, 270, 299 A

[56] References Cited

U.S. PATENT DOCUMENTS

| | | | |
|---|---|---|---|
| 3,641,362 | 2/1972 | Gamble | 307/456 |
| 3,980,898 | 9/1976 | Priel | 307/475 X |
| 4,311,927 | 1/1982 | Ferris | 307/456 X |
| 4,330,723 | 5/1982 | Griffith | 307/300 X |
| 4,339,675 | 7/1982 | Ramsey | 307/300 X |
| 4,339,676 | 7/1982 | Ramsey | 307/300 X |
| 4,430,585 | 2/1984 | Kirk, Jr. | 307/456 X |
| 4,449,063 | 5/1984 | Ohmichi et al. | 307/280 X |
| 4,454,432 | 6/1984 | Wood | 307/456 |

Primary Examiner—Stanley D. Miller
Assistant Examiner—David R. Bertelson
Attorney, Agent, or Firm—William E. Koch

[57] ABSTRACT

A three state gate having an output capable of assuming an active high, an active low, or a high impedance state is disclosed that has circuitry for removing the inherent Miller capacitive charge from an output transistor during the high impedance state. An output means includes an upper transistor for supplying current to the output and a lower transistor for sinking current from the output. A phase-splitter means coupled to the output means determines the conductivity of the upper and lower transistors. The phase-splitter means is responsive to an input signal and an output enable signal. A first transistor has a collector coupled to the base of the upper output transistor. A second transistor has a collector coupled to the base of the lower output transistor, and a base coupled to the emitter of the first transistor. A third transistor has a collector coupled to the base of the first transistor. A fourth transistor has an emitter coupled to an emitter of the third transistor and the output enable terminal. A fifth transistor has a base coupled to a collector of the fourth transistor, a collector coupled to a base of the phase-splitter transistor, and an emitter coupled to the base of the lower output transistor.

2 Claims, 2 Drawing Figures

*– PRIOR ART –*

TRI-STATE LOGIC GATE HAVING REDUCED MILLER CAPACITANCE

BACKGROUND OF THE INVENTION

1. Field of the Invention

This invention relates in general to three state gates and, more particularly, to a noninverting three state gate wherein the Miller capactiance for the high impedance state is substantially reduced.

2. Background Art

Three state gates have an output which is capable of assuming an active high, an active low, or a high impedance state. Generally, most previously known gates having bipolar transistors comprise a push-pull output driver stage, a phase-splitting stage, and an input stage. The push-pull output driver stage comprises a dual transistor arrangement wherein an upper transistor is coupled between a DC voltage supply and an output load and a lower transistor is coupled between the output load and ground. In operation, a high output voltage is realized at the output terminal by turning on the upper transistor and turning off the lower transistor; a low output voltage is realized by turning off the upper transistor and turning on the lower transistor; and a high impedance is achieved by turning off both transistors.

The phase-splitting stage comprises a transistor coupled between the bases of the two output transistors of the output stage that would selectively turn on one of the two output stage transistors. The input stage typically comprises a transistor responsive to an input signal for turning on and off the transistor of the phase-splitting stage. Output enable circuitry is responsive to an output enable signal and is coupled to the collector and base of the phase-splitting transistor for directing current away therefrom, thus turning off both of the upper and lower transistors of the output stage, thereby giving a high impedance at the output terminal.

When a high impedance output is desired and both the upper and lower transistors are off, the base-collector capacitive charge stored on the lower transistor presents spiking problems for the high impedance output. This base-collector capacitive charge, known as Miller capacitance, is multiplied by the beta of the lower transistor. A previously known method of reducing this Miller capacitance includes a first NPN transistor having a collector connected to the base of the lower output transistor and an emitter coupled to ground. A second NPN transistor has its collector connected to the base of the first NPN transistor and is coupled to a voltage supply by a first resistor. The emitter of the second NPN transistor is connected to ground. A third NPN transistor has its collector connected to the base of the second NPN transistor, its base coupled to a voltage supply by a resistor, and its emitter connected to the output enable means. This circuitry, described in more detail in the Detailed Description of the Preferred Embodiment, ensures that the base of the lower output transistor is pulled to a low impedance, i.e., the Miller capacitance of the lower output transistor is pulled to ground through the collector-emitter of the first NPN transistor.

However, this previously known circuitry requires a relatively large amount of current that requires large gate devices and metalization for a monolithically integrated circuit.

Thus, a need exists for an improved three state gate having circuitry for reducing the Miller capacitance for the high impedance state having lower current, faster transitions into and out of the high impedance state, a lighter load for the output enable circuitry and reduced chip area requirements.

SUMMARY OF THE INVENTION

Accordingly, it is an object of the present invention to provide an improved three state gate having a reduced Miller capacitance in the high impedance state.

Another object of the present invention is to provide a three state gate having circuitry for reducing the Miller capacitance in the high impedance state that requires less current than previously known methods.

A further object of the present invention is to provide a three state gate having circuitry for reducing the Miller capacitance in the high impedance state that transitions into and out of the high impedance state at a faster rate.

In carrying out the above and other objects of the invention in one form, there is provided an improved three state gate having an input terminal, an output enable terminal, and an output terminal for providing an output having an active high, an active low, and a high impedance state. A phase-splitting transistor is coupled to the input terminal and the output enable terminal. An output means is coupled between the phase-splitting transistor and the output terminal and is responsive to the phase-splitting transistor for providing one of the output states. The output means includes an upper transistor having a base coupled to a collector of the phase-splitting transistor, and a lower transistor having a base coupled to an emitter of the phase-splitting transistor and a collector coupled to an emitter of the upper transistor. A first transistor has a collector coupled to the collector of the phase-splitting transistor. A second transistor has a base coupled to the emitter of the first transistor, and a collector coupled to the emitter of the phase-splitting transistor. A third transistor has its collector connected to the base of the first transistor. A fourth transistor has an emitter connected to the emitter of the third transistor and to the output enable terminal. A fifth transistor has a collector connected to the base of the phase-splitting transistor and an emitter connected to the collector of the second transistor.

The above and other objects, features, and advantages of the present invention will be better understood from the following detailed description taken in conjunction with the accompanying drawings.

DETAILED DESCRIPTION OF THE PREFERRED EMBODIMENT

Figure 1:
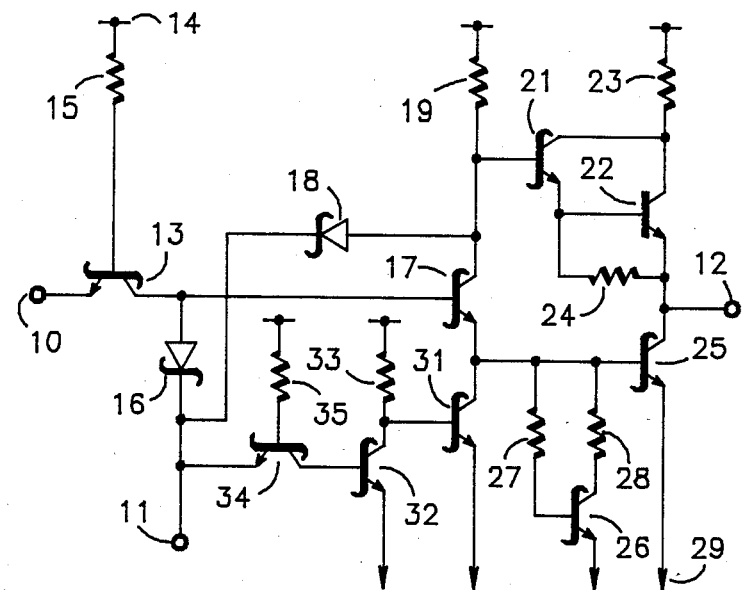
FIG. 1 illustrates in schematic form a previously known three state gate.

Referring to FIG. 1, a previously known three state gate is shown and includes input terminal 10, output enable terminal 11, and output terminal 12. Schottky NPN transistor 13 has its emitter connected to input terminal 10 and is responsive to an input signal which may assume a first or second voltage level, its base coupled to supply voltage terminal 14 by resistor 15, and its collector connected to the anode of diode 16 and the base of Schottky NPN transistor 17. The cathode of diode 16 is connected to output enable terminal 11 and the cathode of diode 18. The collector of phase-splitting Schottky NPN transistor 17 is connected to supply voltage terminal 14 by resistor 19 and is connected to the anode of diode 18 and the base of Schottky NPN transistor 21. The collector of transistor 21 is connected to the collector of upper output NPN transistor 22 and is coupled to supply voltage terminal 14 by resistor 23. The emitter of transistor 21 is coupled to output terminal 12 by resistor 24 and is connected to the base of transistor 22.

The emitter of transistor 17 is connected to the base of lower Schottky NPN transistor 25, and coupled to the base and collector of Schottky NPN transistor 26 by resistors 27, 28, respectively. The emitters of transistors 25, 26 are connected to supply voltage terminal 29. Transistor 26 and resistors 27, 28 provide an active pull-down for the base of transistor 25. The emitter of transistor 22 is connected to output terminal 12 for supplying current thereto and the collector of transistor 25 is connected to output terminal 12 for sinking current therefrom. When current is supplied to the base of transistor 17, its collector goes low, thereby turning off transistors 21, 22. The base of transistor 25 receives current from the emitter of transistor 17, thereby causing transistor 25 to conduct and sink current from output terminal 12. When no current is supplied to the base of transistor 17, its collector goes high, causing transistors 21, 22 to conduct and output terminal 12 to go high. Since the base of transistor 25 receives no current, transistor 25 does not sink current from output terminal 12.

During the active high and active low states just described, an output enable signal on output enable terminal 11 will be high, thereby preventing any current from flowing through diode 16, 18. When an output enable signal goes low, current is drawn away from the bases of transistors 17, 21. Therefore, both transistors 22, 25 will be off and output terminal 12 will have a high impedance.

During this high impedance state, the inherent base-collector capacitive charge of transistor 25 will appear on output terminal 12. This previously known circuit has substantially eliminated this inherent capacitive charge by providing a low impedance path for the base of transistor 25 when the output enable signal is low. Schottky NPN transistor 31 provides this path by having a collector connected to the base of transistor 25 and an emitter connected to supply voltage terminal 29. Schottky NPN transistor 32 has its collector connected to the base of transistor 31 and coupled to supply voltage terminal 14 by resistor 33. Schottky NPN transistor 34 has its collector connected to the base of transistor 32, its base coupled to supply voltage terminal 14 by resistor 35, and its emitter connected to output enable terminal 11.

When the output enable signal on output enable terminal 11 is high, current flows from the base to collector of transistor 34, thereby turning on transistor 32 and turning off transistor 31. When the output enable signal goes low, current flows through the emitter of transistor 34 and transistor 32 is turned off. The collector of transistor 32 goes high, thereby turning on transistor 31, thereby providing the low impedance path for the base of transistor 25.

Figure 2:
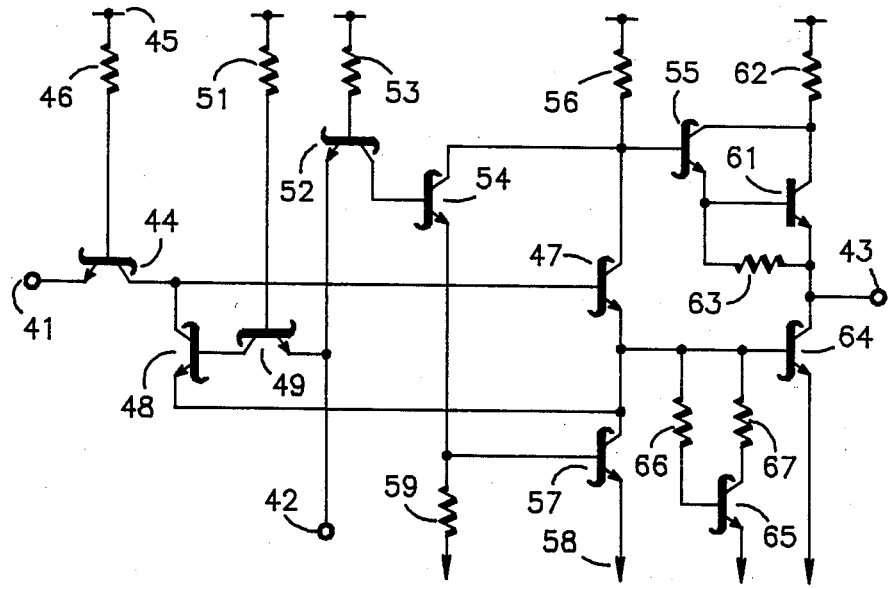
FIG. 2 illustrates in schematic form the preferred embodiment of the present invention.

Referring now to FIG. 2, the preferred embodiment of the present invention includes input terminal 41, output enable terminal 42, and output terminal 43. Schottky NPN transistor 44 has its emitter connected to input terminal 41 and is responsive to an input signal which may assume a first or a second voltage level, its base coupled to supply voltage terminal 45 by resistor 46, and its collector connected to the base of phase-splitting Schottky NPN transistor 47 and the collector of Schottky NPN transistor 48. Schottky NPN transistor 49 has its collector connected to the base of transistor 48, its base coupled to supply voltage terminal 45 by resistor 51, and its emitter connected to both output enable terminal 42 and the emitter of Schottky NPN transistor 52. Transistor 52 has its base coupled to supply voltage terminal 45 by resistor 53 and its collector connected to the base of Schottky NPN transistor 54. The collector of transistor 54 is connected to the base of Schottky NPN transistor 55 and the collector of transistor 47, and is coupled to supply voltage terminal 45 by resistor 56. Schottky NPN transistor 57 has its collector connected to the emitters of transistors 47, 48, its emitter connected to supply voltage terminal 58 and its base connected to the emitter of transistor 54 and coupled to supply voltage terminal 58 by resistor 59.

The collector of transistor 55 is connected to the collector of upper output NPN transistor 61 and coupled to supply voltage terminal 45 by resistor 62. The emitter of transistor 55 is connected to the base of transistor 61 and is coupled to output terminal 43 by resistor 63. Lower output Schottky NPN transistor 64 has its base connected to the emitter of transistor 47 and coupled to the base and collector of transistor 65 by resistors 66, 67, respectively. The emitters of transistors 64, 65 are connected to supply voltage terminal 58. The emitter of transistor 61 is connected to output terminal 43 for supplying current thereto and the collector of transistor 64 is connected to output terminal 43 for sinking current therefrom. Transistor 65 and resistors 66, 67 provide an active pull-down for the base of transistor 64.

For an active high or active low state, the output enable signal on output enable terminal 42 will be low, thereby reverse biasing transistors 48, 54. A high input signal on input terminal 41 causes current to flow through the base-collector of transistor 44 thereby turning on transistor 47. Since transistor 47 is conducting, its collector goes low and transistors 55, 61 are off and will provide no current to output terminal 43. The current through transistor 47 is directed to the base of transistor 64, thereby sinking any current from output terminal 43 and providing for an active low state. A low input signal on input terminal 41 diverts current away from the base of transistor 47, turning transistor 47 off and thereby providing a high voltage at the bases of transistors 55, 61 and providing no current to the base of transistor 64.

When the output enable signal goes high, current will flow through the base-collector of transistors 49, 52, thereby turning on transistors 48, 54, respectively. Transistor 48 will draw current away from the base of transistor 47 and transistor 54 will draw current away from the base of transistors 55, 61. Since transistor 54 is conducting, current is supplied to the base of transistor 57 thereby providing a low impedance to the base of transistor 64 while at the same time insuring that transistor 64 is off.

Comparing the circuits of FIG. 1 and FIG. 2, it is seen that the current through resistor 19 is drained away through the output enable terminal 11 during a high impedance state. In FIG. 2, since the output enable terminal 42 is high, the current through resistor 56 is diverted through transistor 54 to drive transistor 57 which insures transistor 64 is off while providing a low impedance at the base of transistor 64 for reducing the Miller capacitance. Furthermore, it is seen that the current through resistor 35 of FIG. 1 is also drawn out through the output enable terminal 11, while the current through resistor 53 of FIG. 2 is used to drive the base of transistor 54.

In order to illustrate further advantages of the present invention, it will be necessary to describe voltage levels along certain current paths. The voltage appearing across the base-emitter of a Schottky transistor will be referred to as $V_{BE}$ (approximately 0.75 volts). The voltage across the base-collector of a Schottky transistor will be referred to as $V_{SCH}$ (approximately 0.50 volts) and the voltage across the collector-emitter of a Schottky transistor in the active region will be referred to as $V_{SAT}$ (approximately 0.25 volts).

During the high impedance state, the collector of $_{SCH}$ transistor 17 in FIG. 1 will have a voltage level of V for diode 18 plus $V_{SAT}$ for a buffer attached to output enable terminal 11. In the active low state, when transistor 17 is conducting, the collector of transistor 17 will have a voltage level equal to $V_{SAT}$ for transistor 17 and $V_{BE}$ for transistor 25. Therefore, the collector of transistor 17 is pulled lower during the high impedance state and the collector of transistor 17 must increase in voltage in the transition from the high impedance state to the active low state. It is seen from FIG. 2, that the collector of transistor 47 in the high impedance state is at a voltage level of $V_{SAT}$ for transistor 54 and $V_{BE}$ for transistor 57. During an active low state, the collector of transistor 47 will be at $V_{SAT}$ for transistor 47 and $V_{BE}$ for transistor 64. Therefore, it is seen that the base of transistor 55 (collector of transistor 47) will not have to rise to a higher voltage level during transistion, thereby resulting in a faster transition in the voltage level on output terminal 43.

By now it should be appreciated that there has been provided an improved three state gate having circuitry for reducing the Miller capacitive effect during the high impedance state having a substantially reduced current drain and a substantially increased output transition speed from the high impedance state to the active low state.

We claim:

1. A gate circuit having a first input terminal responsive to a first input signal, a second input terminal responsive to a second input signal, said first and second input signals each having a first and second state, and an output terminal, comprising:

means coupled to said first input terminal, said second input terminal, and said output terminal for generating an output signal having a first and second state dependent upon said states of said first and second input signals, said means including a control transistor having a collector and an emitter;

a first transistor having a collector coupled to said collector said control transistor;

a second transistor having a collector coupled to said emitter of said control transistor, and a base coupled to said emitter of said first transistor;

a third transistor having a collector coupled to a base of said first transistor;

a fourth transistor having an emitter coupled to an emitter of said third transistor and said second input terminal; and a fifth transistor having a base coupled to a collector of said fourth transistor, a collector coupled to a base of said control transistor, and an emitter coupled to the collector of said second transistor.

2. A three state gate having a first voltage terminal, a second voltage terminal, an input terminal, an output disable terminal, and an output terminal for providing an output having an active high, an active low, and a high impedance state, comprising:

a phase-splitting transistor having a base coupled to said input terminal for generating a phase-splitting signal;

output means coupled between said phase-splitting transistor and said output terminal and responsive to said phase-splitting signal for providing one of said active high, said active low, or said high impedance state, said output means including a pullup transistor having a base coupled to a collector of said phase-splitting transistor, and a pulldown transistor having a base coupled to an emitter of said phase-splitting transistor, and a collector coupled to an emitter of said pullup transistor;

a first transistor having a collector coupled to said collector of said phase-splitting transistor;

a second transistor having a collector coupled to said emitter of said phase-splitting transistor, an emitter coupled to said second voltage terminal and a base coupled to said emitter of said first transistor;

a third transistor having a collector coupled to a base of said first transistor and a base coupled to said second voltage terminal;

a fourth transistor having a base coupled to said first voltage terminal and an emitter coupled to an emitter of said third transistor and said output disable terminal; and a fifth transistor having a base coupled to a collector of said fourth transistor, a collector coupled to a base of said phase-splitting transistor, and an emitter coupled to the collector of said second transistor.

* * * * *